United States Patent
Shibagaki

(10) Patent No.: US 8,090,245 B2
(45) Date of Patent: Jan. 3, 2012

(54) APPARATUS FOR HEAT-TREATING SUBSTRATE AND METHOD FOR HEAT-TREATING SUBSTRATE

(75) Inventor: Masami Shibagaki, Fuchu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 141 days.

(21) Appl. No.: 12/418,063

(22) Filed: Apr. 3, 2009

(65) Prior Publication Data

US 2009/0190908 A1    Jul. 30, 2009

Related U.S. Application Data

(63) Continuation of application No. PCT/JP2008/065395, filed on Aug. 28, 2008.

(30) Foreign Application Priority Data

Sep. 3, 2007 (JP) .................................. 2007-227449

(51) Int. Cl.
*A21B 2/00* (2006.01)
(52) U.S. Cl. ........................................ 392/416; 392/407
(58) Field of Classification Search ........................ None
See application file for complete search history.

(56) References Cited

U.S. PATENT DOCUMENTS

| | | | |
|---|---|---|---|
| 5,429,498 A | 7/1995 | Okase et al. | 432/152 |
| 5,651,670 A | 7/1997 | Okase et al. | 432/152 |
| 5,662,469 A | 9/1997 | Okase et al. | 432/6 |
| 5,683,518 A * | 11/1997 | Moore et al. | 118/730 |
| 6,027,244 A * | 2/2000 | Champetier et al. | 374/130 |
| 6,087,632 A * | 7/2000 | Mizosaki et al. | 219/390 |
| 6,091,889 A * | 7/2000 | Hwu et al. | 392/416 |
| 6,156,079 A * | 12/2000 | Ho et al. | 29/25.01 |

(Continued)

FOREIGN PATENT DOCUMENTS

JP    5-190464    7/1993

(Continued)

OTHER PUBLICATIONS

Shibagaki, M., et al., "Development of the Novel Bombardment Anneal System (EBAS) for SiC Post Ion Implantation Anneal," Materials Science Forum, vols. 483-485, p. 609-612 (2005).

(Continued)

*Primary Examiner* — Thor Campbell
(74) *Attorney, Agent, or Firm* — Fitzpatrick, Cella, Harper & Scinto

(57) ABSTRACT

An apparatus for heat treating a substrate includes a substrate holder unit including a substrate stage on which a substrate is to be placed and which is made of one of a carbon and a carbon covered material, and a heating unit which is provided above the substrate stage and includes a heat dissipation surface opposing the substrate stage, and heats the substrate placed on the substrate stage in noncontact therewith radiation heat from the heat dissipation surface. In addition, a chamber contains the substrate holder unit and the heating unit, and an elevating device vertically moves at least one of the substrate holder unit and the heating unit in the chamber to bring the substrate stage and the heat dissipation surface of the heating unit close to each other or apart from each other. The substrate holder unit includes a radiation plate which is arranged under the substrate stage at a gap therefrom, and a reflection plate which is arranged under the radiation plate at a gap therefrom.

19 Claims, 8 Drawing Sheets

U.S. PATENT DOCUMENTS

| | | | |
|---|---|---|---|
| 6,313,443 B1 * | 11/2001 | Harnik et al. | 219/405 |
| 6,497,767 B1 | 12/2002 | Okase et al. | 118/666 |
| 7,075,037 B2 * | 7/2006 | Shimizu et al. | 219/390 |
| 2005/0069309 A1 * | 3/2005 | Kimura et al. | 392/416 |
| 2008/0213988 A1 * | 9/2008 | Shibagaki et al. | 438/530 |
| 2009/0191724 A1 | 7/2009 | Shibagaki et al. | 438/796 |
| 2009/0202231 A1 | 8/2009 | Shibagaki et al. | 392/416 |
| 2009/0218579 A1 | 9/2009 | Shibagaki | 257/77 |
| 2010/0006560 A1 | 1/2010 | Egami et al. | |

FOREIGN PATENT DOCUMENTS

| | | |
|---|---|---|
| JP | 5-190464 A | 7/1993 |
| JP | 7-268627 | 10/1995 |
| JP | 7-268627 A | 10/1995 |
| JP | 10-045474 | 2/1998 |
| JP | 10-045474 A | 2/1998 |
| JP | 10-125690 | 5/1998 |
| JP | 10-125690 A | 5/1998 |
| JP | 2000-323487 | 11/2000 |
| JP | 2000-323487 A | 11/2000 |
| JP | 2003-318076 | 11/2003 |
| JP | 2003-318076 A | 11/2003 |
| JP | 2005-299990 | 10/2005 |
| JP | 2005-299990 A | 10/2005 |
| JP | 2005-302936 | 10/2005 |
| JP | 2005-302936 A | 10/2005 |

OTHER PUBLICATIONS

Kimoto, T., et al., "Nitrogen Ion Implantation into α-SiC Epitaxial Layers," Phys. Stat. Sol., vol. 162, p. 263-276 (1997).

International Search Report for PCT/JP2008/065395 dated Oct. 28, 2008.

Shibagaki, M. et al., "Development of the Novel Bombardment Anneal System (EBAS) for SiC Post Ion Implantation Anneal", Materials Science Forum, 2005, pp. 609-612, vols. 483-485.

Kimoto, T. et al., "Nitrogen Ion Implantation into α-SiC Epitaxial Layers", Phys. Stat. Sol., 1997, pp. 263-276, vol. 162.

\* cited by examiner

APPARATUS FOR HEAT-TREATING SUBSTRATE AND METHOD FOR HEAT-TREATING SUBSTRATE

TECHNICAL FIELD

The present invention relates to an apparatus for heat-treating a substrate, for example, a silicon carbide (SiC) substrate. More particularly, the present invention relates to an apparatus that can heat-treat a substrate in a vacuum uniformly and quickly, and a method for heat-treating a substrate using the apparatus.

BACKGROUND ART

As an apparatus for heat-treating a substrate, one is known in which a heating plate is arranged at the lower portion of a vacuum chamber, an annular cooling unit is arranged at the upper portion of the vacuum chamber, and a substrate holder made of a material with high thermal conductivity is arranged between the heating plate and cooling unit to be vertically movable (for example, see patent reference 1). When a substrate is heat-treated with this apparatus, the substrate holder on which the substrate is placed is moved downward. The lower surface of the substrate holder is brought into contact with the heating plate to heat the substrate through the substrate holder. After that, the substrate holder is moved upward to bring the periphery of the substrate holder into contact with the cooling unit, thereby cooling the substrate through the substrate holder. As an apparatus which heat-treats a substrate in non-contact with a heating plate, one is known which is provided with an airtight reaction chamber which heats the substrate at a high temperature, and a cooling portion (for example, see patent reference 2).
Patent Reference 1:
Japanese Patent Laid-Open No. 2003-318076
Patent Reference 2:
Japanese Patent Laid-Open No. 2005-299990

DISCLOSURE OF INVENTION

Problems that the Invention is to Solve

The apparatus for heat-treating the substrate and the method for heat-treating the substrate described in patent reference 1 perform heating by heat conduction through the substrate holder. Accordingly, if the substrate and substrate holder are not in contact with each other evenly, nonuniformity may occur in heating. For example, if the substrate is warped through an implantation and heating process, it may be in local contact and non-contact with the substrate holder. This degrades the surface uniformity as the heat-treating characteristics after heating. Since the substrate is cooled by the periphery of the substrate holder, the temperature of the entire substrate cannot be uniformly lowered. Moreover, it takes time to cool the substrate through its center.

In the apparatus for heat-treating the substrate according to patent reference 2, the substrate is heated to a high temperature by radiation heat. It is desired to uniformly heat the substrate more efficiently. Even when heating the substrate to a high temperature, the temperature should not be conducted to the chamber wall. As the substrate processing apparatus of patent reference 2 performs cooling with the wall of a cooling portion, a large space must be reserved for the cooling portion. This makes the apparatus bulky.

Means of Solving the Problems

The present invention has been made in view of the conventional problems described above, and has as its first object to provide an apparatus for heat-treating a substrate and a method for heat-treating a substrate that can heat a substrate in a vacuum uniformly and quickly. It is the second object of the present invention to provide an apparatus for heat-treating a substrate and a method for heat-treating a substrate that can cool the entire portion of the heated substrate quickly. It is the third object of the present invention to provide an apparatus for heat-treating a substrate that can be downsized, and a method for heat-treating a substrate that uses the same.

An apparatus for heat-treating a substrate according to the present invention which solves at least one of the above objects is an apparatus for heat-treating a substrate, the apparatus comprising:

a substrate holder unit including a substrate stage on which a substrate is to be placed and which is made of carbon or a carbon-covered material, a heating unit which is provided above the substrate stage, includes a heat dissipation surface opposing the substrate stage, and heats the substrate placed on the substrate stage in noncontact therewith with radiation heat from the heat dissipation surface, a chamber in which the substrate holder unit and the heating unit are arranged, and an elevating device which vertically moves at least one of the substrate holder unit and the heating unit in the chamber to bring the substrate stage and the heat dissipation surface of the heating unit close to each other or to be spaced apart from each other, wherein the substrate holder unit comprises a radiation plate which is arranged under the substrate stage at a gap therefrom, catches heat emitted from a lower surface of the substrate stage, and radiates the caught heat toward the substrate stage, and a reflection plate which is arranged under the radiation plate at a gap therefrom and reflects heat emitted from the radiation plate.

A method for heat-treating a substrate according to the present invention is a method for heat-treating a substrate using an apparatus for heat-treating a substrate, said apparatus having:

a substrate holder unit including a substrate stage on which a substrate is to be placed, and a heating unit which is provided above the substrate stage, includes a heat dissipation surface opposing the substrate stage, and heats the substrate placed on the substrate stage in non-contact therewith with radiation heat from the heat dissipation surface, the method comprising:

a placing step of placing the substrate, having an implantation region in a surface thereof, on the substrate stage such that a surface thereof which is on an implantation region side faces a heat dissipation surface side of the heating unit, and a heat-treating step of heat-treating the substrate using an apparatus for heat-treating a substrate described above according to the present invention.

Effects of the Invention

The apparatus for heat-treating a substrate and the method for heat-treating a substrate according to this invention heat a substrate in non-contact with it with radiation heat from the heat dissipation surface of the heating unit. The heat dissipation surface of the heating unit opposes the substrate stage in which the substrate is to be placed, and its radiation heat can irradiate the substrate uniformly regardless of whether or not the substrate is warped. Therefore, even if the substrate is warped more or less, it can be heated uniformly.

The substrate stage is made of carbon or a carbon-covered material. At least the surface of the substrate stage is made of carbon having high emissivity. Hence, the substrate also simultaneously receives radiation heat from the substrate stage which is heated by radiation. Namely, the substrate is heated mainly by the radiation heat from the heat dissipation surface of the heating unit, and subsidiarily by the radiation heat from the substrate stage. Thus, the substrate can be heated quickly.

At least the surface of the substrate stage is made of carbon having high emissivity. During cooling, when the radiation heat is absorbed, the temperature of the entire substrate stage can be decreased uniformly and quickly. Accordingly, the substrate can be cooled quickly and uniformly.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

The embodiments of the present invention will be described hereinafter in detail. Note that the constituent components described in the embodiments are merely examples. The technical scope of the present invention is determined by the claims and not limited by the following individual embodiments.

Figure 1:
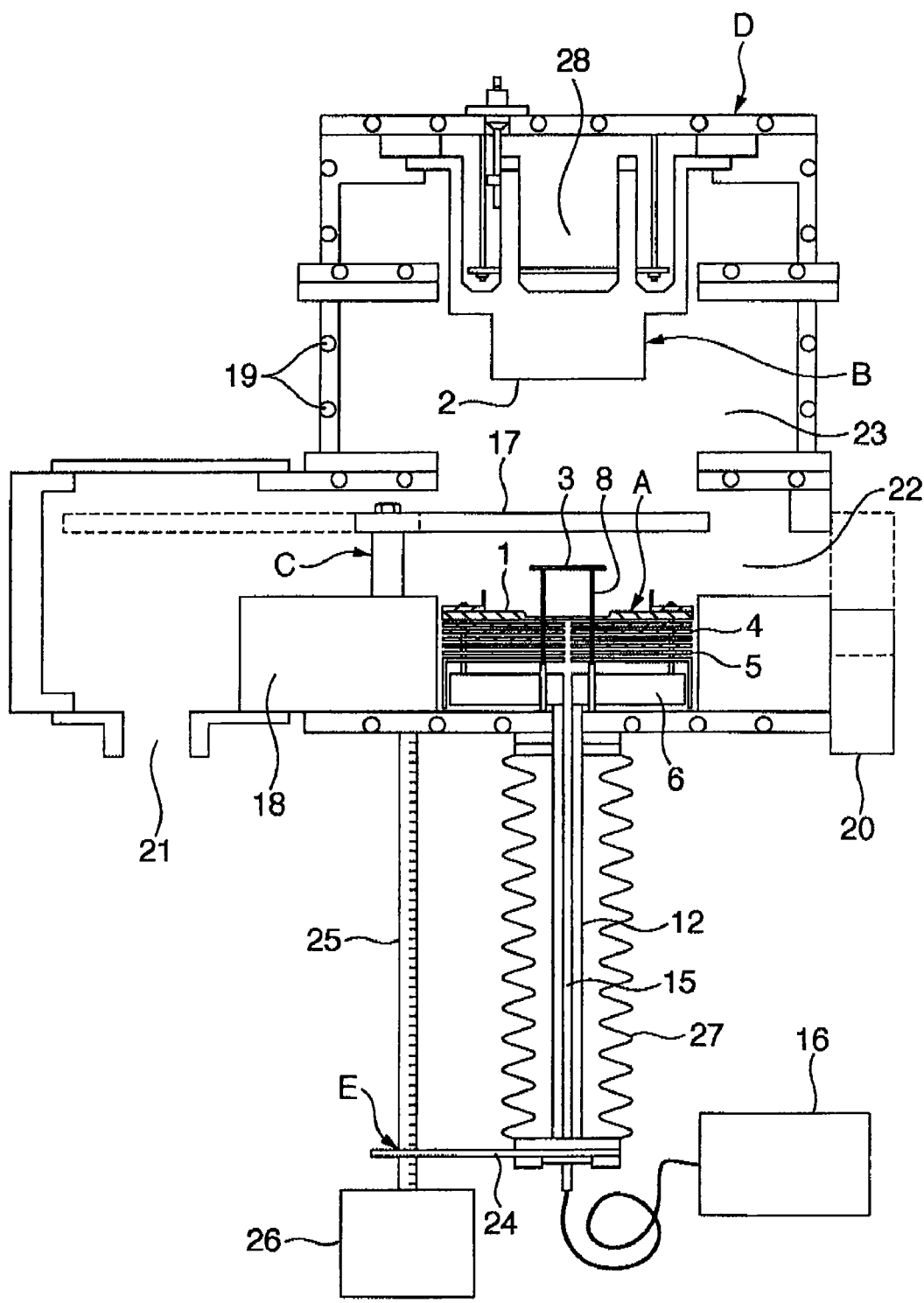
FIG. 1 is a schematic sectional view of an apparatus for heat-treating a substrate according to an embodiment of the present invention to show a state during substrate loading/unloading.
Figure 2:
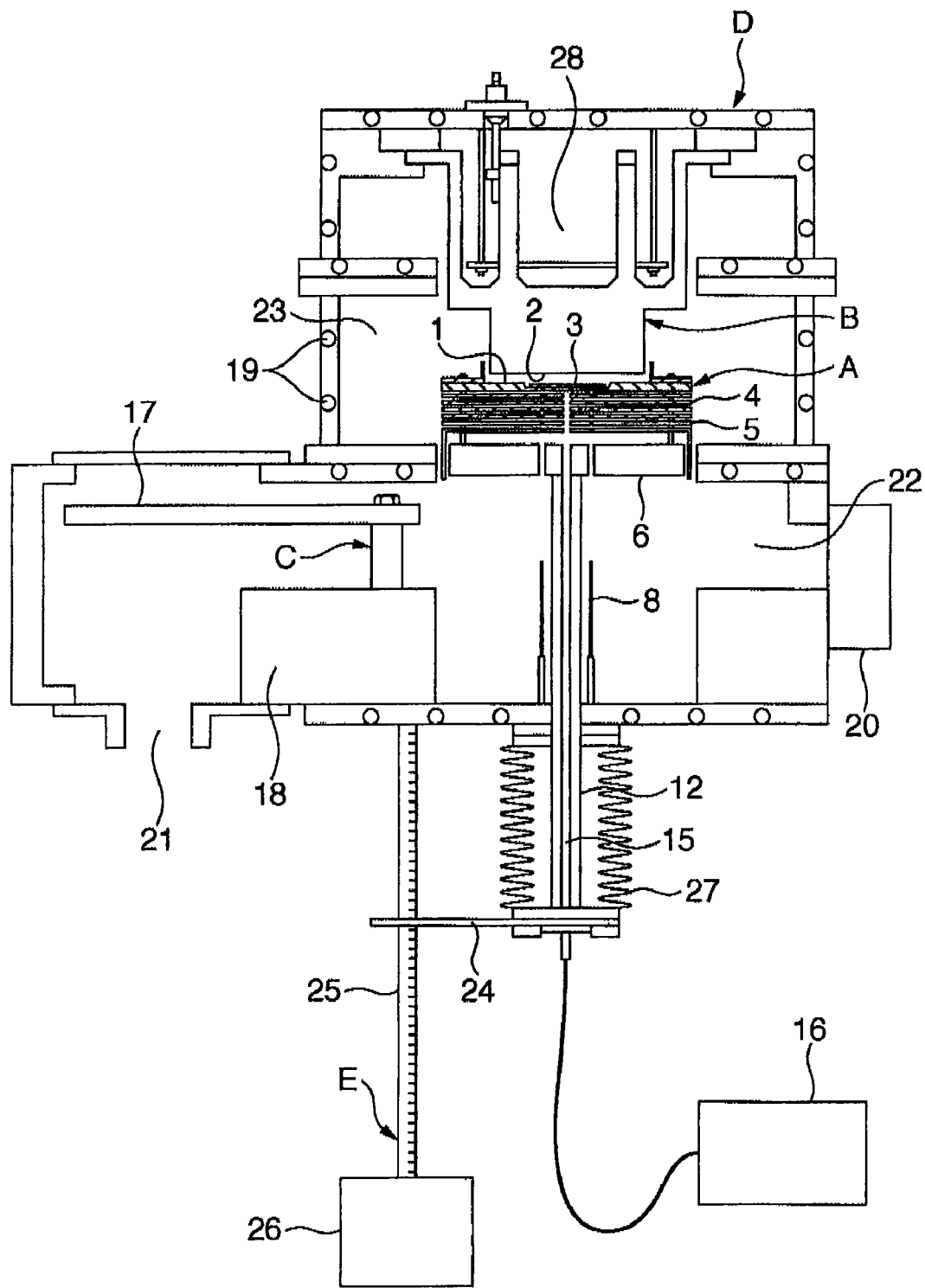
FIG. 2 is a schematic sectional view showing a state during substrate heating.
Figure 3:
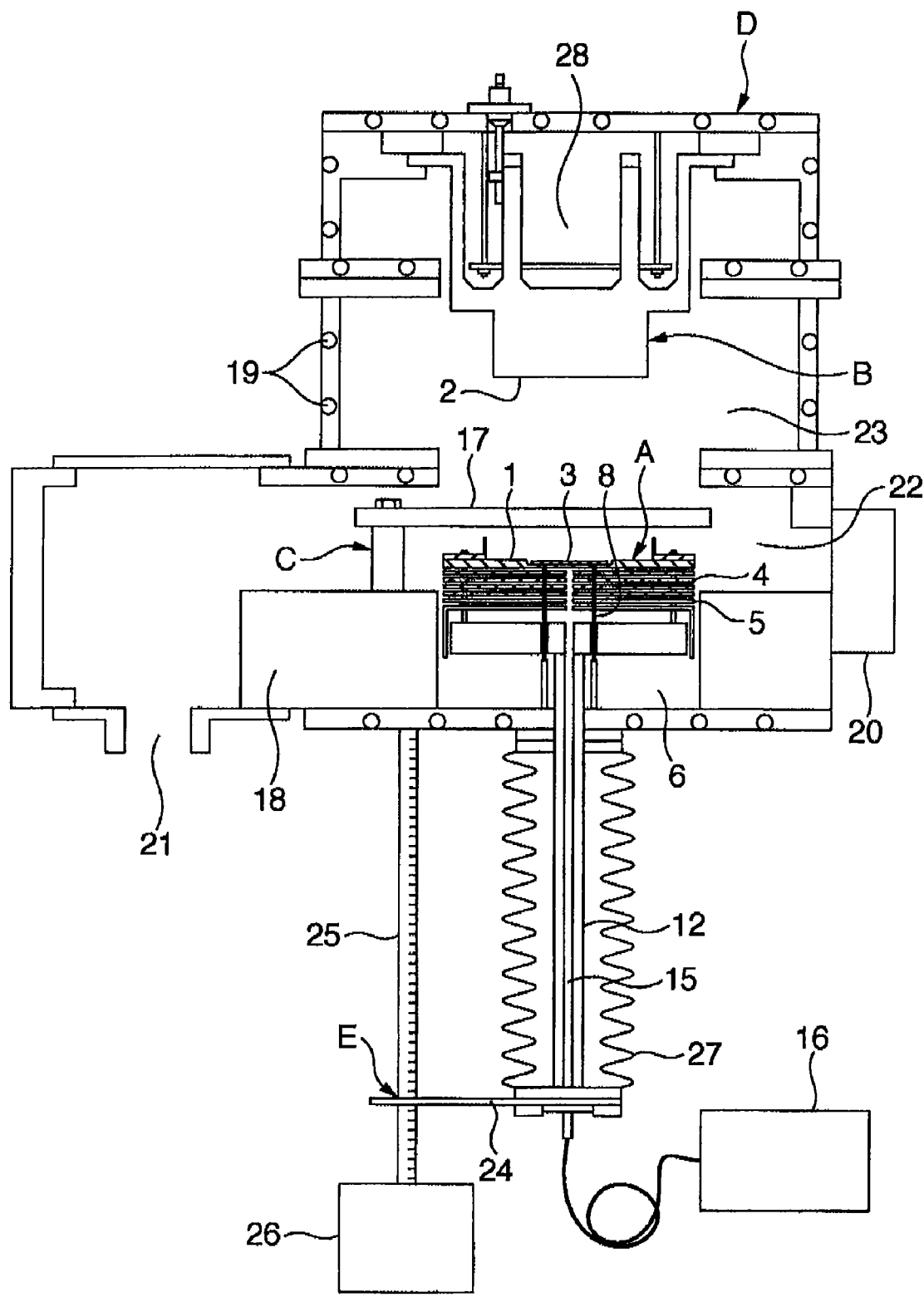
FIG. 3 is a schematic sectional view showing a state during substrate cooling.
Figure 4:
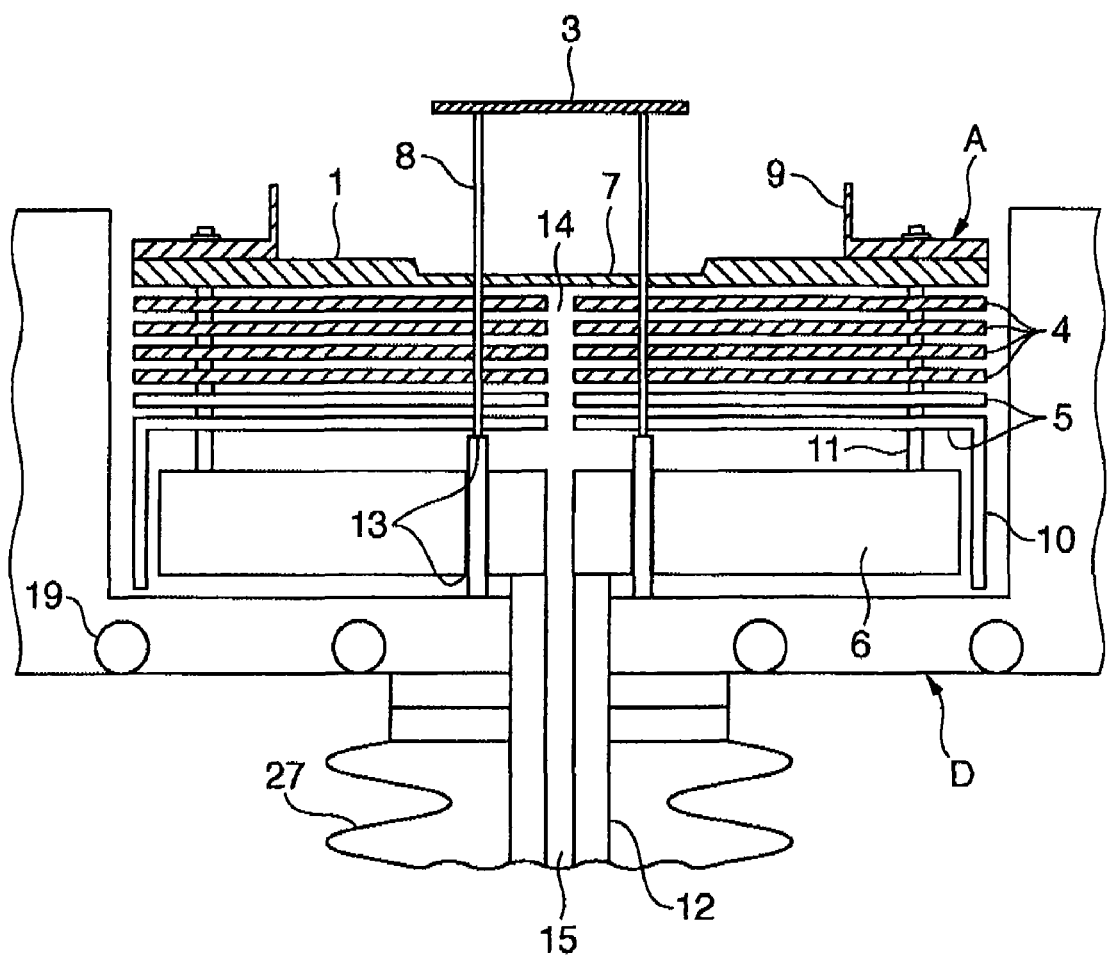
FIG. 4 is an enlarged sectional view of a substrate holder unit in FIG. 1 and its periphery.
Figure 5:
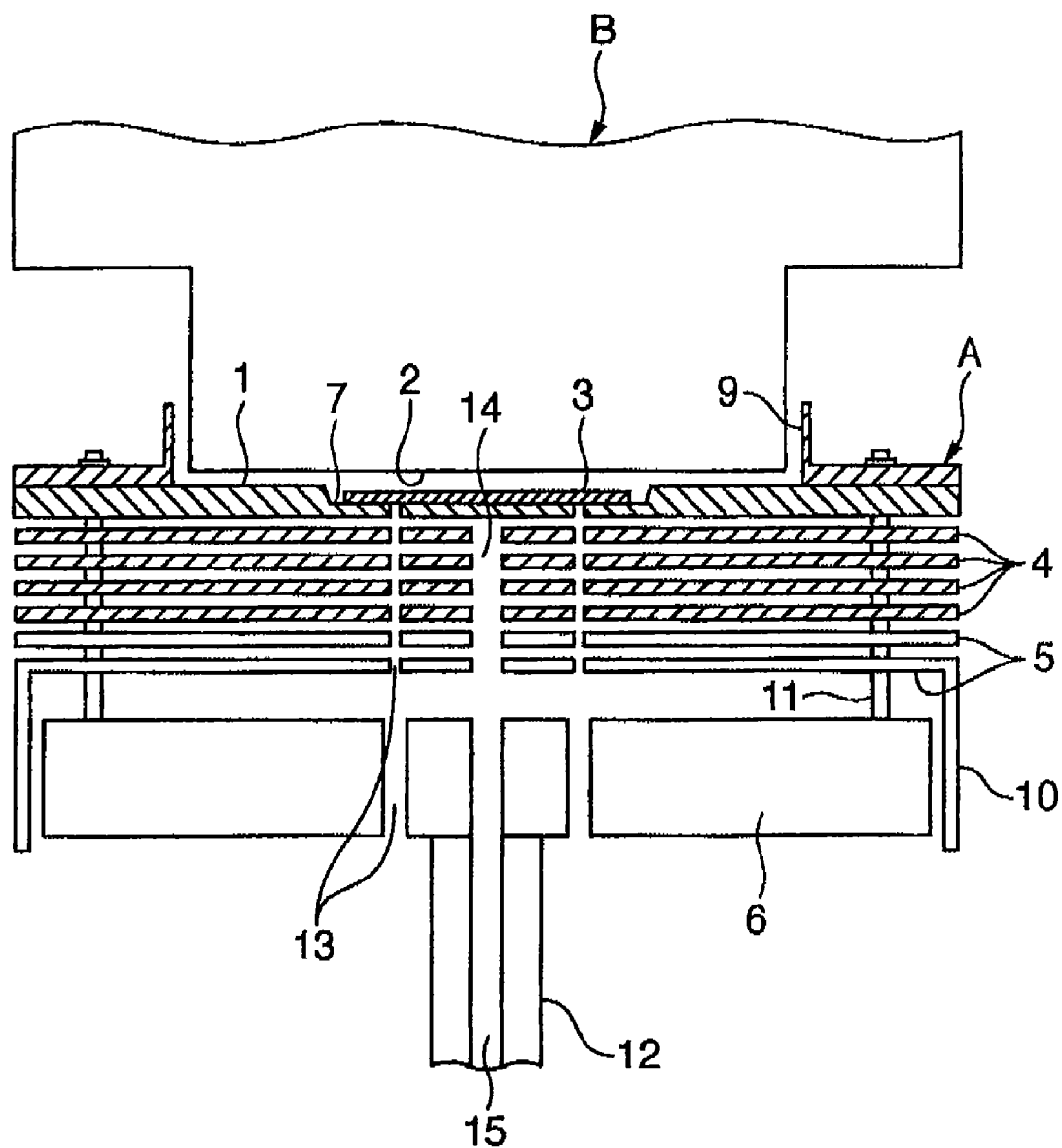
FIG. 5 is an enlarged sectional view of the substrate holder unit in FIG. 2 and its periphery.

FIG. 1 shows an apparatus for heat-treating a substrate according to an embodiment of the present invention. FIG. 1 is a schematic sectional view showing a state during substrate loading/unloading, FIG. 2 is a schematic sectional view showing a state during substrate heating, and FIG. 3 is a schematic sectional view showing a state during substrate cooling. FIG. 4 is an enlarged sectional view of a substrate holder unit in FIG. 1 and its periphery, FIG. 5 is an enlarged sectional view of the substrate holder unit in FIG. 2 and its periphery, and FIG. 6 includes views to explain substrate stages. Note that in FIGS. 1 to 6A, 6B, and 6C, the same reference numerals denote the same members or portions.

As shown in FIGS. 1 to 3, according to the apparatus for heat-treating the substrate of this embodiment, a substrate holder unit A, heating unit B, and shutter device C are arranged in a vacuum chamber D.

The substrate holder unit A includes a substrate stage 1 at its uppermost stage. The heating unit B is arranged above the substrate stage 1 and includes a heat dissipation surface 2 opposing the substrate stage 1. The substrate holder unit A can be vertically moved by an elevating device E. The substrate stage 1 and the heat dissipation surface 2 of the heating unit B can be controlled to move close to and separate from each other by the operation of the elevating device E. When the substrate holder unit A is moved upward as shown in FIG. 2 so that the substrate 3 on the substrate stage 1 is close to the heat dissipation surface 2, the heating unit B heats the substrate 3 in noncontact with it with radiation heat from the heat dissipation surface 2.

The substrate holder unit A in FIG. 1 is at the lower position, and that in FIG. 2 is at the upper position. FIG. 4 shows the substrate holder unit A in FIG. 1 and its periphery in enlargement, and FIG. 5 shows the substrate holder unit A in FIG. 2 and its periphery in enlargement. The substrate holder unit A will mainly be described with reference to FIGS. 4 and 5, and its main members will only be denoted in FIGS. 1 to 3.

As shown in FIGS. 4 and 5, the substrate holder unit A includes the substrate stage 1 at its uppermost portion, four radiation plates 4 under the substrate stage, two reflection plates 5 under the radiation plates 4, and a cooling panel 6 at the lowermost portion.

A substrate 3 is to be placed on the substrate stage 1. The center of the upper surface of the substrate stage 1 forms a substrate placing portion 7 where the substrate 3 is to be placed. The substrate 3 shown in FIG. 4 is lifted and supported by lift pins 8 (to be described later). Upon movement of the substrate holder unit A, when the substrate stage 1 moves upward beyond the lift pins 8, the substrate 3 is transferred onto the substrate placing portion 7 and placed on it, as shown in FIG. 5.

The substrate stage 1 is made of a material that has high emissivity, can absorb radiation heat efficiently, can emit the absorbed heat efficiently, and can withstand high heat. More specifically, the substrate stage 1 forms a plate made of carbon or a carbon-covered material. Examples of carbon that forms the substrate stage 1 can include glassy carbon, graphite, and pyrolytic carbon. Examples of the carbon-covered material can include a material obtained by covering a ceramic material with one, two, or more types of such carbon.

To suppress heat capacity and shorten the cooling time, the substrate stage 1 is preferably thin. The thickness of the substrate stage 1 changes depending on the constituent material and the recess amount of the substrate placing portion 7 (to be described later), and is preferably 2 mm to 7 mm from the viewpoint of compatibility of both the strength and the reduction of the cooling time.

Figure 6A:
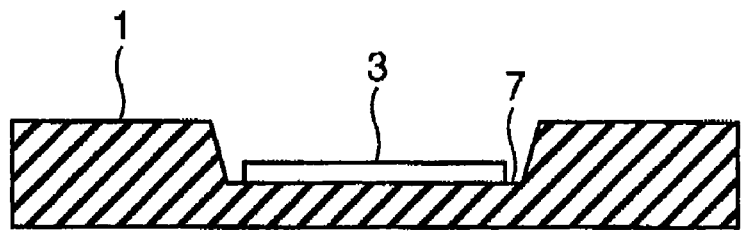
FIG. 6A is a view to explain a substrate stage.
Figure 6B:
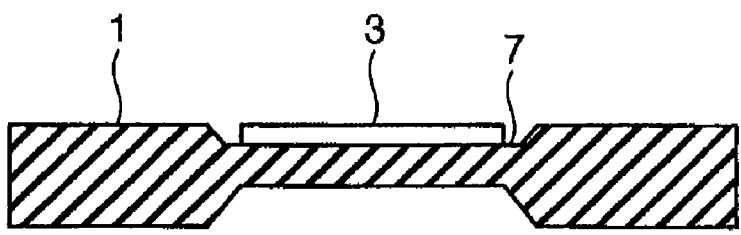
FIG. 6B is a view to explain a substrate stage.
Figure 6C:
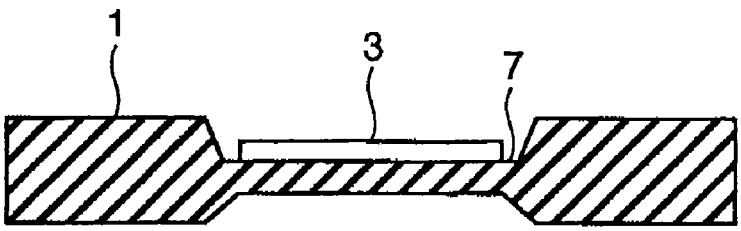
FIG. 6C is a view to explain a substrate stage.

The substrate placing portion 7 provided at the center of the substrate stage 1 is formed as a recess. The thickness of the substrate stage 1 is preferably larger around the substrate placing portion 7 than at the substrate placing portion 7. Then, when heating the substrate 3 by the heating unit B (to be described later), the radiation heat from the heat dissipation surface 2 can be suppressed from being diffused to outside the substrate 3, and the heat capacity of the outer peripheral portion of the substrate placing portion 7 of the substrate stage 1 can be increased, so that heat dissipation from the outer peripheral portion of the substrate 3 can be suppressed. This compensates for heating of the peripheral portion of the substrate 3 that tends to be insufficient, so that the entire portion of the substrate 3 can be heated more uniformly. As a mode in which the substrate placing portion 7 is formed as a recess and the thickness of the substrate stage 1 is larger around the substrate placing portion 7 than at the substrate placing portion 7, the modes shown in FIGS. 6A to 6C are available. FIG. 6A shows a mode in which a comparatively deep recess is formed in only that upper surface of the substrate stage 1 which serves as the substrate placing portion 7. FIG. 6B shows a mode in which recesses are formed in that upper surface of the substrate stage 1 which serves as the substrate placing portion 7 and in that lower surface of the substrate stage 1 which corresponds to the upper surface, respectively, such that the recess in the lower surface is deeper than the recess in the upper surface. FIG. 6C shows a mode in which the depths of the upper and lower recesses are opposite to those in FIG. 6B.

As shown in FIG. 5, an annular wall 9, which is to receive the heat dissipation surface 2 of the heating unit B in it when the substrate stage 1 and the heat dissipation surface 2 of the heating unit B are close to each other, projects around the substrate placing portion 7 of the substrate stage 1. The annular wall 9 is preferably made of carbon or a carbon-covered material similar to that of the substrate stage 1. The presence of the annular wall 9 can suppress the radiation heat from the heat dissipation surface 2 of the heating unit B from being released to the periphery, thus improving the efficiency of heating the substrate 3 by the heat dissipation surface 2.

The four radiation plates 4 and the two reflection plates 5 are arranged between the substrate stage 1 and cooling panel 6 at gaps from each other.

The radiation plates 4 form plates made of carbon or a carbon-covered material in the same manner as the substrate stage 1, and are arranged under the substrate stage 1 at gaps from it. The radiation plates 4 oppose the lower surface of the substrate stage 1. When the substrate 3 is heated, the radiation plates 4 catch the heat emitted from the lower surface of the substrate stage 1 and radiate the caught heat toward the substrate stage 1. This can suppress temperature drop caused by heat emission from the substrate stage 1, thus facilitating quick heating.

The radiation plates 4 are preferably provided to raise the temperature of the substrate stage 1 efficiently. When providing the radiation plates 4, they may comprise one radiation plate, or a plurality of radiation plates other than the four radiation plates shown in FIG. 5. If the radiation plates 4 comprise a plurality of radiation plates, the temperature of the substrate stage 1 can be raised quickly as described above by the comparatively thin radiation plates 4. As the comparatively thin radiation plates can be employed, the heat capacity of each radiation plate 4 can be suppressed so that the cooling time can be shortened. The thicknesses of the radiation plates 4 change depending on the constituent material and the number of radiation plates 4, and are preferably 1 mm to 3 mm from the viewpoint of compatibility of both quick temperature rise during heating and the reduction of the cooling time.

The two reflection plates 5 are arranged under the radiation plates 4 (when only one radiation plate 4 is provided, under this radiation plate 4; when a plurality of radiation plates 4 are provided, under the lowermost radiation plate 4) at gaps from each other. Each reflection plate 5 is made of a refractory metal such as molybdenum or tungsten, and at least its surface (upper surface) which is on the radiation plates 4 side is mirror-finished. The reflection plates 5 serve to reflect heat emitted by the substrate stage 1 and radiation plates 4.

If one or the plurality of reflection plates 5 are provided under the radiation plates 4, temperature drop due to heat emission from the substrate stage 1 and radiation plates 4 can be suppressed more easily, so that quick heating can be performed more easily. The reflection plates 5 can block heat emission from the substrate stage 1 and radiation plates 4, and accordingly temperature rise of the chamber can be prevented, which is preferable.

Figure 9:
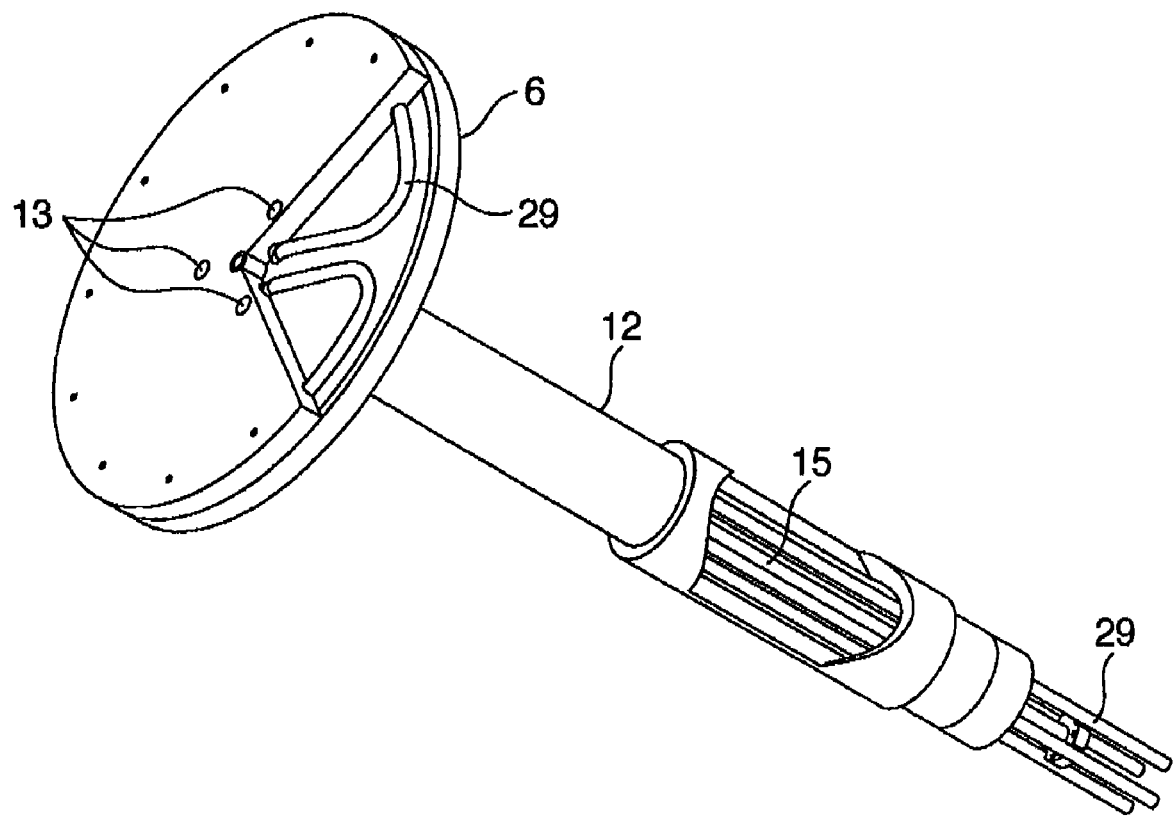
FIG. 9 is a perspective view showing the internal structure of an elevating shaft 12.

When the reflection plates 5 are arranged, the cooling panel 6 can be arranged under the reflection plates 5 (when only one reflection plate 5 is provided, under this reflection plate 5; when a plurality of reflection plates 5 is provided, under the lowermost reflection plates 5) at a gap. The cooling panel 6 is a panel body which is cooled by a cooling means such as a water cooling mechanism. As the cooling panel 6 is arranged to oppose the lower surfaces of the substrate stage 1, radiation plates 4, and reflection plates 5, when cooling the substrate 3, the cooling panel 6 can promote uniform, quick cooling of these members located above it. FIG. 9 is a perspective view showing the internal structure of an elevating shaft 12 connected to the cooling panel 6. A temperature measurement hole 15 to be connected to a temperature measurement unit 16 is formed in the elevating shaft 12. A plurality of refrigerant circulating channels 29 is also formed in the elevating shaft 12 to supply a refrigerant to the cooling means of the cooling panel 6 and recover the refrigerant from the cooling means.

When heating the substrate 3 shown in FIG. 5, if the substrate 3 is cooled by the cooling panel 6, the temperature of the substrate holder unit A can be controlled to a predetermined value, as will be described later. This is useful in improving the reproducibility of the temperature of the substrate stage heated by radiation heating.

When providing the cooling panel 6, preferably, the reflection plates 5 are provided, as described above, so heating of the substrate 3 will not be interfered with. Also, the outer wall of the cooling panel 6 is preferably formed of mirror-finished stainless steel, a mirror-finished aluminum alloy, or the like, so that heat absorption is suppressed.

When providing the cooling panel 6, preferably, a skirt 10 extends from the periphery of the lowermost reflection plate 5 (when only one reflection plate 5 is provided, this reflection plate 5) to surround the cooling panel 6. With the skirt 10, heat absorption from the circumferential side surface of the cooling panel 6 can be suppressed, so that any adverse effect on heating the substrate 3 can be prevented.

The substrate stage 1, radiation plates 4, and reflection plates 5 are supported on the cooling panel 6 through connection screws 11 by interposing a heat-resistant, heat-insulating material such as an alumina ceramic material or zirconium oxide ceramic material among them. The cooling panel 6 is connected to the distal end of the elevating shaft 12 of the elevating device E (see FIG. 1) (see FIG. 9). As will be described later, the elevating device E vertically moves the cooling panel 6 in the axial direction of the elevating shaft 12. Upon vertical movement of the cooling panel 6, the substrate holder unit A provided above the cooling panel 6 is moved vertically.

The substrate holder unit A has a plurality of lift pin through holes 13 extending through the substrate stage 1, radiation plates 4, reflection plates 5, and cooling panel 6 which constitute the substrate holder unit A. The lift pin through holes 13 are formed at positions to extend particularly in the substrate placing portion 7 of the substrate stage 1. The plurality of lift pins 8 vertically extend from the bottom of the vacuum chamber D to correspond to the positions of the lift pin through holes 13.

In FIG. 4, the plurality of lift pins 8 vertically extending from the bottom of the vacuum chamber D project from the substrate stage 1 through the lift pin through holes 13. The lift pins 8 are provided at such positions in such a number that they can lift and support the substrate 3 on the substrate placing portion 7 with their distal ends. When the substrate holder unit A in the state in FIG. 4 moves upward and the substrate stage 1 moves upward above the lift pins 8, the substrate 3 is transferred onto the substrate placing portion 7. With the substrate 3 being placed on the substrate placing portion 7, when the substrate holder unit A moves downward and the lift pins 8 project from the substrate stage 1 through the lift pin through holes 13, the distal ends of the lift pins 8 lift and support the substrate 3 on the substrate placing portion 7, thus achieving a state shown in FIG. 4.

A measurement hole 14 is formed immediately under the center of the substrate placing portion 7 of the substrate stage 1 to extend through the radiation plates 4, reflection plates 5, and cooling panel 6. The measurement hole 14 continues to a measurement hole 15 formed at the center of the elevating shaft 12. Because of the measurement holes 14 and 15, the temperature measurement unit 16 shown in FIG. 1 can measure the radiation heat from the substrate stage 1 through a thermal infrared transmitting window made of quartz. As the temperature measurement unit, a radiation thermometer can be employed.

The heating unit B includes the heat dissipation surface 2 and a heater 28 to heat the heat dissipation surface 2. As the heater, an electron bombardment heating type heater, a high-frequency induction heating type heater, a resistance heating type heater, or the like can be employed. The heat dissipation surface 2 forms a heat-resistant black surface and can be obtained by carbon coating using, for example, glassy carbon, pyrolytic carbon, or amorphous carbon. If the heat dissipation surface 2 is such a carbon coating surface, degassing and particle generation in a vacuum can also be suppressed.

As shown in FIGS. 1 to 3, when the substrate holder unit A moves downward and the substrate stage 1 and the heat dissipation surface 2 of the heating unit B are separated from each other, the shutter device C can advance the shutter 17 to a portion between the substrate stage 1 and heat dissipation surface 2, or retreat it from between them. The shutter device C includes a shutter driving device 18 to advance/retreat the shutter 17.

The shutter 17 serves as a heat barrier. As shown in FIGS. 1 and 3, when the substrate holder unit A moves downward and the substrate stage 1 and heat dissipation surface 2 are spaced apart from each other, the shutter 17 advances to the portion between the substrate stage 1 and heat dissipation surface 2 to block the heat of the heat dissipation surface 2 from irradiating the substrate stage 1. When the substrate holder unit A moves upward, the shutter 17 is rotated by the shutter driving device 18 and retreated from between the substrate stage 1 and heat dissipation surface 2 to the position indicated in FIG. 2 (this position is indicated by a broken line in FIG. 1). The shutter 17 is maintained at the retreat position after the substrate holder unit A moves upward until it moves downward to a position where it is not interfered with by the shutter 17.

Preferably, the shutter device C has a cooling means for the shutter 17, for example, a water cooling mechanism, so that it can promote cooling of the substrate stage 1 and the substrate 3 on the substrate stage 1 when the shutter 17 advances. If the substrate stage 1 and substrate 3 are to be cooled by the cooling means, the shutter 17 can be made of stainless steel or an aluminum alloy. Preferably, that surface (upper surface) of the shutter 17 which opposes the heat dissipation surface 2 of the heating unit B when the shutter 17 advances is a mirror-finished reflection surface, so heat from the heat dissipation surface 2 can be blocked easily. Preferably, that surface (lower surface) of the shutter 17 which opposes the substrate stage 1 of the substrate holder unit A when the shutter 17 advances is a heat absorption surface which forms a heat-resistance black surface, so the substrate stage 1 and the substrate 3 on the substrate stage 1 can be cooled quickly. The heat absorption surface can be obtained by forming the wall surface using a black material such as black alumite as well as by coating the wall surface with carbon such as glassy carbon, pyrolytic carbon, or amorphous carbon.

When cooling the substrate stage 1 and the substrate 3 on the substrate stage 1 actively by the shutter 17, the lower position of the substrate holder unit A is preferably set at two positions. Namely, the substrate holder unit A is preferably moved downward in two stages to a cooling position where the substrate stage 1 and substrate 3 are close to the lower surface of the shutter 17, and a loading/unloading position where a gap necessary to load/unload the substrate 3 is sufficiently ensured among the substrate stage 1, the substrate 3, and the lower surface of the shutter 17. The cooling position is the position of the substrate holder unit A shown in FIG. 3. The loading/unloading position is the position of the substrate holder unit A shown in FIG. 1.

The cooling means of the shutter 17 can be omitted depending on the heating temperature region of the substrate 3. In this case, the shutter 17 is preferably made of a refractory metal such as molybdenum or tungsten. Even if no cooling means is provided, preferably, that surface of the shutter 17 which opposes the substrate 3 forms a reflection surface and that surface of the shutter 17 which opposes the substrate stage 1 forms a heat absorption surface, so that heat from the heat dissipation surface 2 is blocked and cooling of the substrate stage 1 and the substrate 3 on the substrate stage 1 is promoted.

The vacuum chamber D is a housing made of an aluminum alloy or the like, and a water cooling channel 19 for the water cooling mechanism is formed in its wall. The vacuum chamber D includes a slit valve 20 which is opened/closed when loading/unloading the substrate 3, and an exhaust port 21 which is connected to an exhaust system to evacuate the interior of the vacuum chamber D to a vacuum atmosphere. When supplying cooling water to the water cooling channel 19, the temperature of the housing of the vacuum chamber D can be prevented from increasing excessively.

The vacuum chamber D includes a lower first room 22 and a second room 23 which is above the first room 22 and continuous to it. The heating unit B is arranged in the upper second room 23 such that the heat dissipation surface 2 faces downward. The substrate holder unit A can vertically move between the first room 22 and second room 23. When the substrate holder unit A is moved upward, as shown in FIG. 2, it causes the substrate stage 1 and the heat dissipation surface 2 of the heating unit B to come close to each other while closing the portion between the first room 22 and second room 23 with the cooling panel 6. When the substrate 3 is heated in this manner, heat generated in the second room 23 will not readily leak to the first room 22 under it, so that the cooling operation which takes place, after heating, by moving the substrate holder unit A downward to the first room 22 can be performed more quickly. The inner surface of the vacuum chamber D, particularly the inner surface of the second room 23, is preferably mirror-finished to improve the heating efficiency.

The elevating device E includes the elevating shaft 12 with an upper end connected to the cooling panel 6 of the substrate holder unit A, an elevating arm 24 attached to the lower end portion of the elevating shaft 12, and a ball screw 25 which threadably engages with the elevating arm 24. The elevating device E also includes a rotary driving device 26 which can rotate the ball screw 25 forward/backward, and a bellows cover 27 which covers the slide portion between the elevating shaft 12 and vacuum chamber D to improve the air tightness in the vacuum chamber D and stretches and contracts as the elevating shaft 12 moves vertically. In the elevating device E, the rotary driving device 26 rotates the ball screw 25 forward or backward to move upward or downward the elevating arm 24 which threadably engages with the ball screw 25. Upon upward/downward movement of the elevating arm 24, the elevating shaft 12 is slid vertically, thus moving the substrate holder unit A vertically.

The vacuum chamber is described above. If the vacuum chamber is not to be used, the interior of the chamber needs to be filled with an inert gas such as argon gas.

The driving state of the above apparatus for heat-treating substrate will now be described.

First, as shown in FIG. 1, the slit valve 20 is opened, and the substrate 3 is loaded into the vacuum chamber D. As will be described below, for example, the substrate 3 can be loaded by carrying it into the vacuum chamber D by a robot and placing and supporting it on the lift pins 8, as shown in FIGS. 1 and 4.

Usually, the slit valve 20 portion of the vacuum chamber D is connected to a load/unload lock chamber (not shown) through a transfer chamber (not shown) which accommodates the robot. First, the substrate 3 is set in the load/unload lock chamber. After roughly evacuating the interior of the vacuum chamber D, the load/unload lock chamber and transfer chamber are opened to each other. The interior of the vacuum chamber D is further evacuated. After that, the slit valve 20 is opened, and the robot in the transfer chamber picks the substrate 3 from the load/unload lock chamber and places it on the lift pins 8 by pick & replace.

At this time, the distal end portion of the robot arm is preferably made of carbon or a ceramic material so that it can withstand a high temperature. In order to prevent the robot arm from being exposed to the radiation heat from the heat dissipation surface 2 of the heating unit B, preferably, the shutter 17 has advanced to the portion between the substrate stage 1 and substrate 3.

The robot arm escapes, and the slit valve 20 is closed to render the interior of the vacuum chamber D an independent vacuum chamber. After that, the shutter 17 is retreated and the substrate holder unit A is moved upward. After catching the substrate 3 with the substrate placing portion 7 of the substrate stage 1, the substrate holder unit A is moved further upward to bring the substrate stage 1 of the substrate holder unit A and the heat dissipation surface 2 of the heating unit B close to each other, as shown in FIGS. 2 and 5. At this time, at least the substrate 3 must be in non-contact with the heat dissipation surface 2. Although the substrate stage 1 can be in contact with the heat dissipation surface 2, both the substrate stage 1 and the substrate 3 on the substrate stage 1 are preferably in noncontact with the heat dissipation surface 2. The gap between the heat dissipation surface 2 and substrate 3 is preferably 1 mm to 25 mm, although it depends on the sizes of the heat dissipation surface 2 and substrate 3, the heating temperature, the heating power of the heating unit B, or the like.

Subsequently, the heater 28 of the heating unit B is turned on to heat the substrate 3 with the radiation heat from the heat dissipation surface 2. When the heating temperature is, for example, 1,900° C., heating is continued until the temperature of the substrate stage 1 measured by the temperature measurement unit 16 reaches 1,900° C. When the temperature reaches 1,900° C., this temperature is held until a predetermined heat-treating time (e.g., approximately 1 min) elapses.

After the above heat-treating time elapses, the heater 28 of the heating unit B is turned off, and natural cooling is started. Simultaneously, the substrate holder unit A is moved downward to the cooling position described above, and the shutter 17 is advanced to the position between the substrate stage 1 of the substrate holder unit A and the heat dissipation surface 2 of the heating unit B to promote cooling. After the substrate 3 is cooled to such a temperature (e.g., 200° C.) that the substrate 3 can be taken out with no difficulty, the substrate holder unit A is moved downward to the loading/unloading position described above. While the substrate holder unit A is moved downward from the cooling position to the loading/unloading position, the substrate 3 is transferred onto the lift pins 8 so that it can be taken out easily. After the substrate holder unit A is moved downward to the loading/unloading position, the slit valve 20 is opened, and the robot in the transfer chamber (not shown) takes out the substrate 3.

In the embodiment described above, the substrate holder unit A can move vertically. Alternatively, both the substrate holder unit A and heating unit B may be movable, or the heating unit B as only one of them may be movable. The heating unit B can be vertically moved by arranging the elevating device E of this embodiment on the vacuum chamber D upside down and connecting the elevating shaft 12 to the heating unit B.

If both the substrate holder unit A and heating unit B are movable, the second room 23 of this example may be enlarged vertically so that the substrate holder unit A and heating unit B are largely spaced apart from each other when cooling them. Namely, after heating is performed at the position described with reference to FIG. 2, the substrate holder unit A is moved downward and the heating unit B is moved upward simultaneously. When cooling the substrate 3, the distance between the heat dissipation surface 2 and the substrate stage 1 and substrate 3 on it is increased, thus improving the cooling efficiency. If only the heating unit B is vertically movable, the lift pins 8 may be eliminated. Alternatively, a separate mechanism to vertically move the lift pins 8 becomes necessary. In addition, cooling at the cooling position described above may become difficult to perform, which is inconvenient. Nevertheless, the basic benefit of the embodiment described above can be obtained.

The apparatus for heat-treating the substrate according to the present invention is optimal for heat-treating the substrate 3 having a well region (impurity region) in its surface. Examples of this substrate 3 include one which is obtained by forming an $SiO_2$ film or the like on a bulk SiC substrate that has undergone sacrificial oxidation and a hydrofluoric acid process, forming a mask on the substrate by lithography and dry etching, and implanting aluminum ions as an impurity by an ion implantation device or the like. The well region can be selectively formed in the SiC substrate. The aluminum ions can be implanted in the following manner. For example, TMA (tetramethyl aluminum) is used as a source and excited by a plasma. Al ions to be implanted are extracted by an extracting electrode and analyzing chamber, and implanted. Alternatively, aluminum is used as a source and excited by plasma. Aluminum ions to be implanted are extracted by an extracting electrode and analyzing chamber, and implanted.

Using the apparatus for heat-treating the substrate according to the present invention, the substrate 3 having an implantation region in the surface is placed on the substrate stage 1 such that the surface on the implantation region side faces the heat dissipation surface 2 of the heating unit B. The substrate 3 is heated with the radiation heat from the heat dissipation surface 2, thus heat-treating the substrate 3. With this heat-treating, a heat-treating process with very little surface roughness can be performed. The implantation region refers to a region which is formed by impurity implantation performed when forming a transistor, contact, or channel.

Example 1

A p-type SiC epitaxial layer was formed on a 4H—SiC (0001) substrate by CVD to a thickness of 10 μm. Nitrogen ions were implanted in the resultant substrate at room temperature in a multiple stage manner at a dose of $4 \times 10^{19}$ ions/cm$^3$ to a depth of 220 nm to form a box profile. The substrate sample obtained in this manner underwent heat-treating using an apparatus for heat-treating a substrate according to the present invention as shown in FIGS. 1 to 5.

The substrate sample was placed on the substrate stage 1 such that the nitrogen ion implantation surface faced upward (the heat dissipation surface 2 side of the heating unit B). The gap between the heat dissipation surface 2 of the heating unit B and the nitrogen ion implantation surface of the substrate sample was set to 5 mm. The substrate sample was heat-treated by heating it for 1 min in a pressure reducing atmosphere of $10^{-4}$ Pa. The temperature of the heat dissipation surface 2 during heating was set to 1,900° C.

Table 1 shows the sheet resistance value of the nitrogen ion implantation surface after the process, and the RMS value measured by an AFM and indicating the degree of surface roughness.

Comparative Example 1

A substrate sample identical to that of Example 1 was placed on a conventional plate-like substrate holder incorporating a heating means such that the nitrogen ion implantation surface faced upward (a side opposite to the substrate holder). The substrate sample was similarly heat-treated by heating it for 1 min in a reduced pressure identical to that of Example 1. The temperature of the substrate holder during heating was set to 1,900° C.

Table 1 shows the sheet resistance value of the nitrogen ion implantation surface after the process, and the RMS value measured (measurement range: 4 μm×4 μm) by a damping method using an AFM and indicating the degree of surface roughness.

Comparative Example 2

A substrate sample identical to that of Example 1 was placed on the substrate stage 1 such that the nitrogen ion implantation surface faced downward (the substrate stage 1 side of the substrate holder unit A). The gap between the heat dissipation surface 2 of the heating unit B and the nitrogen ion implantation surface of the sample was set to 5 mm. The substrate sample was heat-treated by heating it for 1 min in a reduced pressure identical to that of Example 1. The temperature of the heat dissipation surface 2 during heating was set to 1,900° C.

Table 1 shows the sheet resistance value of the nitrogen ion implantation surface after the process, and the RMS value measured by the AFM and indicating the degree of surface roughness.

TABLE 1

|  | Sheet Resistance ($\Omega/\square$) | Surface Roughness (RMS value: nm) |
|---|---|---|
| Example 1 | 526 | 0.68 |
| Comparative Example 1 | 551 | 0.87 |
| Comparative Example 2 | 609 | 0.48 |

From Table 1, according to heat-treating using the apparatus for heat-treating the substrate of the present invention, both the sheet resistance value and surface roughness are improved over those of heat-treating using the conventional general apparatus. In Comparative Example 2, the sheet resistance value increases to as high as 609$\Omega/\square$. The temperature of the nitrogen ion implantation surface is thus not increased sufficiently.

Example 2

An n-type SiC epitaxial layer was formed on a 4H—SiC (0001) substrate by CVD to a thickness of 10 μm. Aluminum ions were implanted in the resultant substrate at 500° C. in a multiple stage manner at a dose of $2 \times 10^{18}$ ions/cm$^3$ to a depth of 800 nm to form a box profile. The 3-inch SiC substrate obtained in this manner was employed as a substrate sample, and went under heat-treating using the apparatus for heat-treating the substrate according to the present invention as shown in FIGS. 1 to 5.

The substrate sample was placed on the substrate stage 1 such that the aluminum ion implantation surface faced upward (the heat dissipation surface 2 side of the heating unit B). The gap between the heat dissipation surface 2 of the heating unit B and the nitrogen ion implantation surface of the sample was set to 5 mm. The substrate sample was heat-treated by heating it for 1 min in a reduced pressure atmosphere of $10^{-4}$ Pa. The temperature of the heat dissipation surface 2 during heating was set to 1,900° C.

After the process, the carrier activation ratio was evaluated in accordance with the CV method. An ideal value of as high as 85% was exhibited. Variations in activation ratio in a substrate sample surface were as very small as 5% or less. The RMS value measured (measurement range: 4 μm×4 μm) by the damping method using the AFM was 0.6 nm, which is less than 1 nm. The substrate sample had no step bunching and was flat. No damages to the crystal properties such as cracking caused by a thermal shock or slippage were observed in the heat-treated substrate sample. At this time, the process time per substrate was 12 min including the time required for placing, heating, cooling, and taking out the substrate. The throughput was improved by about 10 times as compared to that obtained using the conventional apparatus that did not employ transport by a robot.

Example 3

Figure 7:
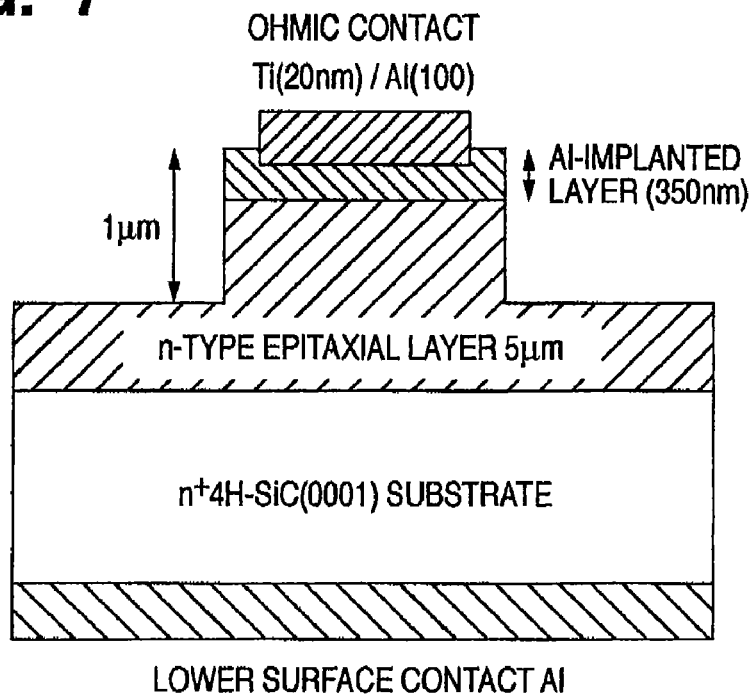
FIG. 7 is a sectional view of a p$^+$-n junction diode fabricated in Example 3.

Heat-treating was performed using the apparatus for heat-treating the substrate according to the present invention as shown in FIGS. 1 to 5. A p$^+$n junction diode formed by ion implantation and having a sectional shape as shown in FIG. 7 was fabricated.

A 5-μm thick epitaxial layer was formed by sacrificial oxidation on an n$^+$-type 4H—SiC (0001) substrate having an off angle of 4°, and was processed with hydrofluoric acid. After that, using an ion implantation device, nitrogen was implanted with an implantation energy of 30 keV to 170 keV in a multiple stage manner at an implantation temperature of 500° C. to a depth of 350 nm to achieve a dose of $3 \times 10^{20}/cm^3$. The SiC substrate obtained in this manner was employed as a substrate sample, and underwent heat-treating using the apparatus for heat-treating the substrate according to the present invention as shown in FIGS. 1 to 5.

The substrate sample was placed on the substrate stage 1 such that the ion implantation surface faced upward (the heat dissipation surface 2 side of the heating unit B). The gap between the heat dissipation surface 2 of the heating unit B and the nitrogen ion implantation surface of the sample was set to 5 mm. The substrate sample was heat-treated by heating it for 1 min in a reduced pressure atmosphere of $10^{-4}$ Pa. The temperature of the heat dissipation surface 2 during heating was set to 1,700° C., 1,800° C., and 1,900° C.

To evaluate the surface flatness of the heat-treated substrate sample, the RMS values of the sample before heat-treating and after heat-treating at each of the above temperatures were measured with an AFM damping mode within the range of the measurement region of 4 μm×4 μm. Table 2 shows the measured RMS values.

Subsequently, each heat-treated sample was sacrificially oxidized and cleaned with hydrofluoric acid to remove the surface denatured layer. Then, patterning of silicon oxide was performed. By an RIE (Reactive Ion Etching) device using a $CF_4$+Ar gas mixture, the SiC layer was etched with a diameter of 100 μm to a depth of 1 μm, thus forming a mesa.

Subsequently, using a vacuum deposition device, titanium (Ti) and aluminum (Al) were deposited for 20 nm and 100 nm, respectively. The resultant sample was heat-treated at 900° C. for 3 min in an argon (Ar) gas atmosphere, thus forming an ohmic electrode.

To evaluate the characteristics of the obtained diode, the current density—voltage characteristics were measured at room temperature using "4200 fabricated by Keithley".

TABLE 2

| Heat-treating Temperature | 1,700° C. | 1,800° C. | 1,900° C. | Before Heat-treating |
|---|---|---|---|---|
| RMS Value | 0.31 nm | 0.43 nm | 0.59 nm | 0.11 nm |

As shown in Table 2, the surface flatness of each substrate sample after heat-treating exhibited a small value almost equal to RM nm even after the substrate sample was heat-treated at 1,900° C. for 1 min. Hence, the substrate sample was very flat.

Figure 8:
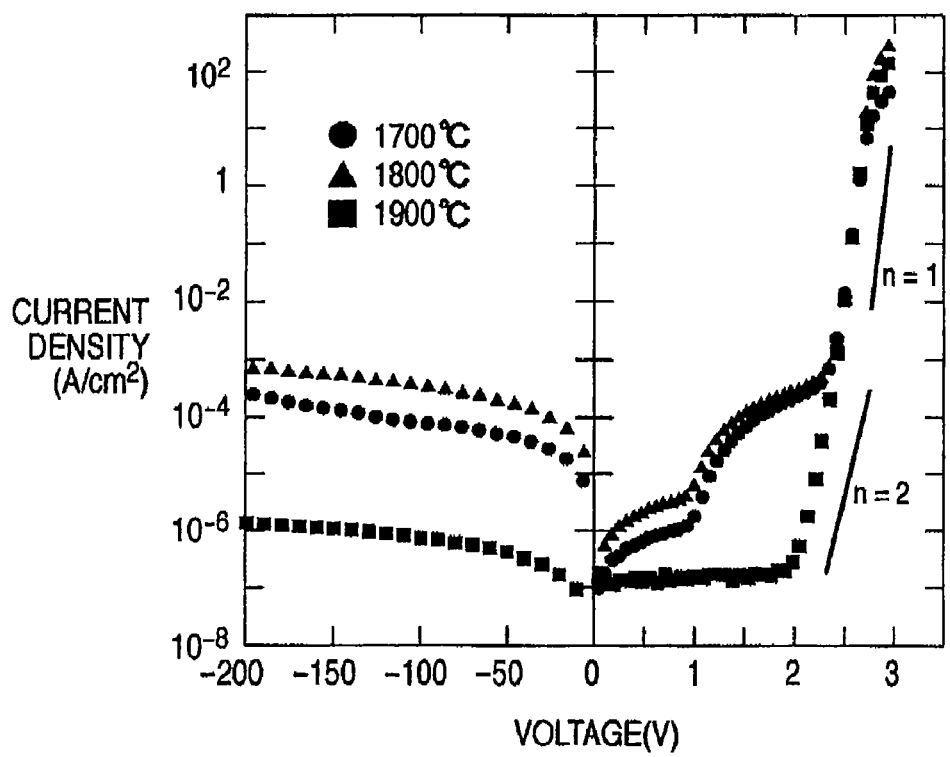
FIG. 8 is a graph showing the heat-treating temperature dependency of the current density—voltage characteristics of the p$^+$n junction diode fabricated in Example 3.

FIG. 8 shows the current density—voltage characteristics of the $p^+n$ diode when the heat-treating temperature is 1,700° C., 1,800° C., and 1,900° C.

When the forward voltage was 0 V to 2 V, a large leak current density was measured at the heat-treating temperature of 1,700° C. and 1,800° C. In the reverse voltage region, a large leak current density on the order of $10^{-4}$ A was measured at the heat-treating temperature of 1,700° C. and 1,800° C.

At the heat-treating temperature of 1,900° C., the leak current density was hardly measured in the reverse voltage region. Even in the forward voltage region, only a very small leak current density on the order of $10^{-6}$ A was measured. This may be because crystal defects formed by ion implantation in the pn junction interface disappeared due to a high-temperature process at the heat-treating temperature of 1,900° C.

In this manner, the apparatus for heat-treating the substrate according to the present invention enabled fabrication of a very good $p^+$-n junction diode. Such pn junction is utilized not only in a pn junction diode but also in a field effect transistor (MOS-FET), junction transistor (J-FET), a MES-FET, and a bipolar transistor (BJT). This improves the characteristics of electronic devices using such SiC, leading to a great improvement in productivity.

In this manner, according to the present invention, the substrate can be uniformly heated to a high temperature efficiently within a short period of time, and cooled within a short period of time. The substrate can thus be transported without damaging the robot arm. A practical throughput can be realized even in an ultra-high-temperature process near 2,000° C.

The preferred embodiments of the present invention have been described with reference to the accompanying drawings. Note that the present invention is not limited to the above embodiments and can be changed in various manners within the technical scope assumed from the claims.

The present invention is not limited to the above embodiments and various changes and modifications can be made without departing from the spirit and scope of the present invention. Therefore, to apprise the public of the scope of the present invention, the following claims are appended.

This application is based upon and claims the benefit of priority from the prior Japanese Patent Application No. 2007-227449, filed Sep. 3, 2007, the entire contents of which are incorporated herein by reference.

The invention claimed is:

1. An apparatus for heat treating a substrate, said apparatus comprising:
    a substrate holder unit including a substrate stage on which a substrate is to be placed and which is made of one of a carbon and a carbon covered material,
    a heating unit which is provided above said substrate stage, includes a heat dissipation surface opposing said substrate stage, and heats the substrate placed on said substrate stage in noncontact therewith radiation heat from said heat dissipation surface,
    a chamber in which said substrate holder unit and said heating unit are arranged, and
    an elevating device which vertically moves at least one of said substrate holder unit and said heating unit in said chamber to bring said substrate stage and said heat dissipation surface of said heating unit close to each other or apart from each other,
    wherein said substrate holder unit further comprises
    a radiation plate which is arranged under said substrate stage at a gap therefrom, catches heat emitted from a lower surface of said substrate stage, and radiates the caught heat toward said substrate stage, and
    a reflection plate which is arranged under said radiation plate at a gap therefrom and reflects heat emitted from said radiation plate, and wherein
    when said substrate holder unit is moved by said elevating device, the gap between said radiation plate and said reflection plate is unchanged.

2. The apparatus for heat treating the substrate according to claim 1, wherein said radiation plate is made of one of carbon and a carbon covered material.

3. The apparatus for heat treating the substrate according to claim 1 or 2, wherein said radiation plate comprises a plurality of radiation plates, and said reflection plate is arranged at a gap from a lowermost one of said plurality of radiation plates.

4. The apparatus for heat treating the substrate according to claim 1, wherein said reflection plate is made of a refractory metal.

5. The apparatus for heat treating the substrate according to claim 1, further comprising a cooling panel which is arranged under said reflection plate at a gap therefrom and cools at least one of said reflection plate, said radiation plate, and said substrate stage,
wherein said reflection plate comprises a plurality of reflection plates, and said cooling panel is arranged at a gap from a lowermost one of said reflection plates.

6. The apparatus for heat treating the substrate according to claim 5, further comprising a skirt which extends from a periphery of said reflection plate to surround said cooling panel in order to suppress heat absorption from a circumferential side surface of said cooling plate,
wherein when said reflection plate comprises the plurality of reflection plates, said skirt extends from a periphery of a lowermost one of said plurality of reflection plates to surround said cooling panel.

7. The apparatus for heat treating the substrate according to claim 5, wherein
said chamber comprises a first room and a second room arranged above said first room and communicating with said first room,
said heating unit is arranged in said second room of said chamber such that said heat dissipation surface faces downward,
said substrate holder unit is vertically movable between said first room and said second room upon operation of said elevating device, and
when said substrate holder unit moves upward to said second room, said substrate stage and said heat dissipation surface of said heating unit come close to each other, and said cooling panel blocks communication between said first room and said second room.

8. The apparatus for heat treating the substrate according to claim 7, further comprising a shutter device which is capable of advancing a shutter to a portion between said substrate stage and said heat dissipation surface and retreating said shutter from between said substrate stage and said heat dissipation surface when said substrate holder unit moves downward to said first room to separate said substrate stage of said substrate holder unit from said heat dissipation surface of said heating unit.

9. The apparatus for heat treating the substrate according to claim 8, wherein when said shutter advances to said portion between said substrate stage and said heat dissipation surface, a surface of said shutter which opposes said heat dissipation surface and a second surface of said shutter which opposes said substrate stage form a reflection surface and a heat absorption surface, respectively.

10. The apparatus for heat treating the substrate according to claim 8, wherein said shutter device includes cooling means for said shutter for allowing to cool said substrate stage and the substrate placed on said substrate stage when said shutter advances to said portion between said substrate stage and said heat dissipation surface.

11. The apparatus for heat treating the substrate according to claim 7, further comprising
a plurality of pins to support said substrate stand vertically in said first room of said chamber, wherein
said substrate holder unit has a plurality of through holes through which said plurality of pins are capable of extending vertically, and
while said substrate holder unit moves downward from said second room to said first room, said plurality of pins project from aid substrate stage through the through holes and support the substrate placed on said substrate stage.

12. The apparatus for heat treating the substrate according to claim 1, wherein said substrate stage has a substrate placing portion to place the substrate thereon, and said substrate stage has a thickness larger than that of said substrate placing portion.

13. The apparatus for heat treating the substrate according to claim 12, wherein said substrate stage includes an annular wall which is formed on a peripheral portion of said substrate placing portion and surrounds said heat dissipation surface of said heating unit, when said substrate stage and said heat dissipation surface of said heating unit are close to each other, to suppress radiation heat from said heat dissipation surface from being released outside.

14. A method for heat treating a substrate using an apparatus for heat treating a substrate, said apparatus having:
a substrate holder unit including a substrate stage on which a substrate is to be placed, and
a heating unit which is provided above the substrate stage, includes a heat dissipation surface opposing the substrate stage, and heats the substrate placed on the substrate stage in noncontact therewith radiation heat from the heat dissipation surface,
the method comprising:
a placing step of placing a substrate, having an implantation region in a surface thereof, on the substrate stage such that a surface thereof which is on an implantation region side faces a heat dissipation surface side of the heating unit, and
a heat treating step of heat treating the substrate using an apparatus for heat treating a substrate according to claim 1.

15. A method for heat-treating a substrate using an apparatus for heat-treating a substrate, said apparatus having:
a substrate holder unit including a substrate stage on which a substrate is to be placed, and
a heating unit which is provided above the substrate stage, includes a heat dissipation surface opposing the substrate stage, and heats the substrate placed on the substrate stage in noncontact therewith radiation heat from the heat dissipation surface,
the method comprising:
a placing step of placing a substrate, having an implantation region in a surface thereof, on the substrate stage such that a surface thereof which is on an implantation region side faces a heat dissipation surface side of the heating unit, and
a heat-treating step of heat-treating the substrate using an apparatus for heat-treating a substrate according to claim 5,
wherein the heat-treating step has a cooling step of cooling the substrate stage by a cooling panel when the substrate is heated.

16. An apparatus for heat treating a substrate, said apparatus comprising:
a substrate holder unit including a substrate stage on which a substrate is to be placed and which is made of one of a carbon and a carbon covered material,
a heating unit which is provided above said substrate stage, includes a heat dissipation surface opposing said substrate stage, and heats the substrate placed on said substrate stage in noncontact therewith radiation heat from said heat dissipation surface,
a chamber in which said substrate holder unit and said heating unit are arranged, and an elevating device which vertically moves said substrate holder unit in said chamber to move said substrate stage and said heat dissipation surface relative to each other, wherein said substrate holder unit further comprises a radiation plate which is arranged under said substrate stage at a gap therefrom, catches heat emitted from a lower surface of said substrate stage, and radiates the caught heat toward said substrate stage, and a reflection plate which is arranged under said radiation plate at a gap therefrom and reflects heat emitted from said radiation plate, and wherein when said substrate holder unit is moved by said elevating device, the gap between said radiation plate and said reflection plate is unchanged.

17. The apparatus for heat treating the substrate according to claim 16, wherein said radiation plate comprises a plurality of radiation plates, and said reflection plate is arranged at a gap from a lowermost one of said plurality of radiation plates.

18. The apparatus for heat treating the substrate according to claim 16, further comprising a cooling panel which is arranged under said reflection plate at a gap therefrom and cools at least one of said reflection plate, said radiation plate, and said substrate stage, wherein said reflection plate comprises a plurality of reflection plates, and said cooling panel is arranged at a gap from a lowermost one of said reflection plates.

19. The apparatus for heat treating the substrate according to claim 16, further comprising a skirt which extends from a periphery of said reflection plate to surround said cooling panel in order to suppress heat absorption from a circumferential side surface of said cooling plate, wherein when said reflection plate comprises the plurality of reflection plates, said skirt extends from a periphery of a lowermost one of said plurality of reflection plates to surround said cooling panel.

* * * * *